United States Patent [19]

Nogawa et al.

[11] Patent Number: 4,861,750
[45] Date of Patent: Aug. 29, 1989

[54] PROCESS FOR PRODUCING SUPERCONDUCTING THIN FILM

[75] Inventors: Shuichi Nogawa; Eiji Kamijo, both of Kyoto, Japan

[73] Assignee: Nissin Electric Co., Ltd., Kyoto, Japan

[21] Appl. No.: 183,099

[22] Filed: Apr. 19, 1988

[30] Foreign Application Priority Data

Apr. 20, 1987 [JP] Japan .................................. 62-96785
Apr. 20, 1987 [JP] Japan .................................. 62-96786
Apr. 20, 1987 [JP] Japan .................................. 62-96787

[51] Int. Cl.$^4$ .......................... B05D 5/12; B05D 3/06; C23C 16/00
[52] U.S. Cl. .......................... 505/1; 427/38; 427/42; 427/62; 427/255.3
[58] Field of Search ................ 505/1; 427/38, 62, 63, 427/42, 255.3

[56] References Cited

U.S. PATENT DOCUMENTS 4,634,600 1/1987 Shimizu et al. ..................... 427/38

FOREIGN PATENT DOCUMENTS 0024214 2/1986 Japan ............................. 204/192.31

OTHER PUBLICATIONS

Martin et al, *Applied Optics*, vol. 22, No. 1, Jan. 1983, pp. 178-184.

Primary Examiner—Norman Morgenstern
Assistant Examiner—Margaret Bueker
Attorney, Agent, or Firm—Finnegan, Henderson, Farabow, Garrett, & Dunner

[57] ABSTRACT

A process for producing a superconducting thin film of the present invention comprises: supplying onto a substrate a group IIa metal and/or an oxide thereof, a group IIIa metal and/or an oxide thereof, and copper and/or an oxide thereof; and irradiating the substrate with an oxygen neutral beam, to thereby form a thin film of IIa-IIIa-Cu oxide.

6 Claims, 2 Drawing Sheets

PROCESS FOR PRODUCING SUPERCONDUCTING THIN FILM

BACKGROUND OF THE INVENTION

The present invention relates to a process for producing a superconducting thin film, notably a process for forming a superconducting thin film made of a IIa-IIIa-Cu oxide on the surface of a substrate.

Superconducting materials hold much promise for use in various cryoelectronic devices such as Josephson devices and SQUID (superconducting quantum interference device) sensors. For use as such superconducting materials, various oxide ceramics have conventionally been prepared by the sintering process. The oxide ceramics so far proposed are described below together with the transition temperatures at which they start to manifest superconductivity:

| Ceramics | Transition Temperature |
| --- | --- |
| Sc—Ba—Cu oxide | 175 K |
| Y—Ba—Cu oxide | 123 K |
| La—Sr—Cu oxide | 54 K |
| La—Ba—Cu oxide | 30 K |

Superconducting materials need to be processed into thin films in order that they can be used in cryoelectronic devices such as Josephson devices and SQUID sensors. However, conventional superconducting materials have been processed into oxide ceramics by the sintering process, which is practically ineffective for the production of superconducting thin films.

SUMMARY OF THE INVENTION

An object, therefore, of the present invention is to provide a process for forming a superconducting thin film on the surface of a substrate.

This object of the present invention can be attained by forming a superconducting thin film of IIa-IIIa-Cu oxide which comprises depositing on the surface of a substrate the vapors of a group IIa metal and/or an oxide thereof, a group IIIa metal and/or an oxide thereof, and copper and/or an oxide thereof while the substrate is irradiated with an oxygen neutral beam during deposition of such vapors.

According to the present invention, the evaporated metals or oxides thereof will descend slowly to be deposited on the substrate. At the same time, the substrate is irradiated with an oxygen neutral beam which effectively implants these metals or oxides thereof into the substrate, forming a mixing layer at the interface between the substrate and the overlying metal or metal oxide layer. This mixing layer renders deposited coatings to be strongly adherent to the substrate so that they will not readily separate from the latter. The evaporated metal will be oxidized with the oxygen neutral beam as it is deposited on the substrate, and the evaporated metal oxide will be supplied with oxygen in an amount compensating for the loss that occurred during vapor deposition. As a result of these procedures, a superconducting thin film made of a IIa-IIIa-Cu oxide is formed on the substrate.

DETAILED DESCRIPTION OF THE PREFERRED EMBODIMENTS

The first embodiment of the present invention will be described hereinafter. In the first embodiment, a group IIa metal and/or an oxide thereof, a group IIIa metal and/or an oxide thereof, and copper and/or an oxide thereof are evaporated simultaneously to form a film made of the IIa-IIIa-Cu oxide, i.e., the oxide of the mixture of the IIa, IIIa and Cu.

Figure 1:
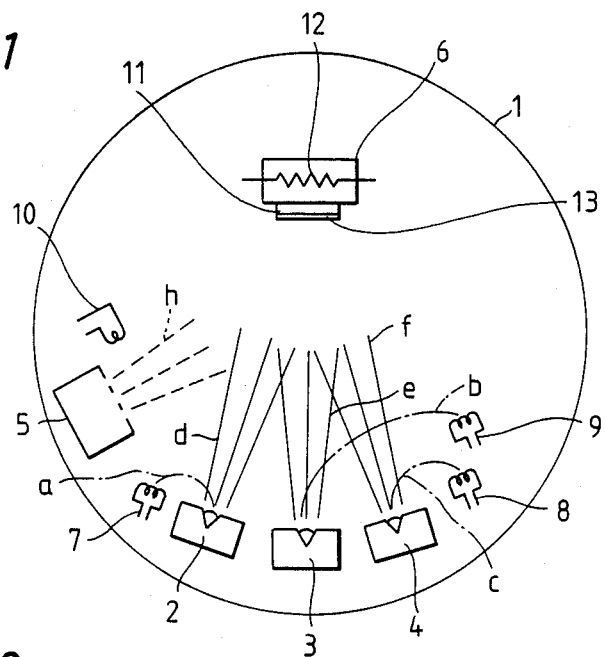
FIG. 1 is a schematic diagram showing a thin-film forming apparatus that may be employed in implementing a process according to the first embodiment of the present invention.

FIG. 1 is a schematic diagram illustrating a thin-film forming apparatus that may be employed in implementing a process according to the first embodiment of the present invention. This apparatus of FIG. 1 forms a thin film by the ion vapor deposition (IVD) process and comprises a vacuum chamber 1 which contains three crucibles 2, 3 and 4 charged with respective metals serving as evaporation sources, an oxygen ion source 5, and a substrate holder 6.

The crucibles 2, 3 and 4 are respectively charged with a group IIa metal (e.g. Sr or Ba) or an oxide thereof, a group IIIa metal (e.g. Sc, Y or La) or an oxide thereof, and copper or an oxide thereof. The crucibles 2, 3 and 4 are respectively irradiated with electron beams a, b and c supplied from electron beam sources 7, 8 and 9 and the metals or oxides thereof in the respective crucibles are evaporated as indicated by d, e and f.

The oxygen ion source 5 generates an oxygen ion beam in the interior of the vacuum chamber 1. A neutralizer 10 is positioned close to the oxygen ion source 5, and the oxygen ions generated from said source are neutralized to an oxygen neutral beam h. Since the thin film 13 formed on the substrate 11 on the substrate holder 6 is an insulator, static charges will build up on the surface of this thin film 13 as a result of irradiation of the pure oxygen ions and if the static buildup exceeds a certain limit, ensuing oxygen ion beams will be repelled or insulation breakdown of the film will occur. Neutralization of the ion beam generated from the oxygen ion source 5 is effective in preventing such troubles. The neutralizer 10 may be in the form of a neutralizing filament made of a suitable metal such as tantalum or tungsten. The electrons generated from this filament will neutralize the oxygen ions. The oxygen neutral beam h is preferably radiated in a quantity slightly greater than what is necessary to oxidize evaporated metals.

The substrate holder 6 has a built-in heater 12 and is fitted on its surface with the substrate 11 made of an insulating material such as sapphire or zirconia.

The metals or oxides thereof in the crucibles 2, 3 and 4 are evaporated by the action of electron beams a, b and c generated from the electron beam sources 7, 8 and 9, respectively, and are deposited on the substrate 11 attached to the surface of the substrate holder 6. The proportions of the metals or oxides thereof to be deposited can be appropriately determined by controlling the doses of electron beams and hence the temperatures to which the filaments in the respective electron beam sources are heated. Preferably, the temperatures of the respective filaments are set at such values that the total amount of a group IIa metal and/or an oxide thereof and a group IIIa metal and/or an oxide thereof will be approximately equal to the amount of copper or an oxide thereof as measured on the surface of the substrate 11.

Simultaneously with the evaporation, the oxygen ions generated from the oxygen ion source and which have been neutralized with the neutralizer 10 into an oxygen neutral beam h are directed onto the surface of the substrate 11. The oxygen neutral beam h not only implants the evaporated metals or oxides thereof into the substrate 11 but also reacts with them to form a superconducting thin film 13 of a IIa-IIIa-Cu oxide on the surface of the substrate 11. The process of the present invention may also be employed to form a coating of a superconducting thin film of IIa-IIIa-Cu oxide on the substrate 11 in wire form. The resulting product can be used as a superconducting coil.

In order to crystallize the evaporated metals or oxides thereof, the substrate 11 is heated with the built-in heater 12 during evaporation. Alternatively, the respective metals or oxides thereof may be evaporated with the substrate 11 being unheated or heated at about 200° C., and with the evaporated metals or oxides thereof being subsequently annealed to become crystalline.

In the above-described embodiment, the three metals or oxides thereof to be deposited are evaporated individually and this has the advantage of enabling the proportions of these metals or oxides thereof to be easily controlled. If desired, an alloy of the three metals or an oxide thereof may be used as an evaporant. Alternatively, a mixture or an alloy of a group IIa metal and/or an oxide thereof and a group IIIa metal and/or an oxide thereof may be charged into one of the two crucibles, with copper and/or an oxide thereof being charged into the other crucible.

The following experiment was conducted in order to show the effectiveness of a process for producing a superconducting thin film according to the first embodiment of the present invention.

EXPERIMENT 1

Three crucibles in a vacuum chamber were charged with Y, Ba and Cu, respectively, which were evaporated at the rates noted below, with an oxygen neutral beam being simultaneously directed onto the substrate so as to form a thin film on its surface.

| Metal | Evaporation Rate |
| --- | --- |
| Y | $1.0 \times 10^{15}$ atom/cm$^2$ · sec |
| Ba | $1.4 \times 10^{15}$ atom/cm$^2$ · sec |
| Cu | $2.4 \times 10^{15}$ atom/cm$^2$ · sec |

The substrate was made of a sapphire crystal (C-face cleaved) which was heated at 800° C. during evaporation. An oxygen ion beam was used as an oxygen ion source. A beam having an energy of 100 eV and 1 mA/cm$^2$ (on the substrate) was neutralized with a neutralizer and the resulting oxygen neutral beam was directed onto the substrate.

As a result, a superconducting thin film with a thickness of 5,000 Å and which was made of Y-Ba-Cu oxide was formed on the surface of the sapphire substrate. A gold electrode was formed on both sides of this superconducting thin film by sputtering and the electrical resistance across this film was measured in liquid nitrogen. Zero resistance was observed between the electrodes.

The same results were attained when Y, Ba and Cu were replaced by their respective oxide forms and ion vapor-deposited on a sapphire substrate. Similar results were also attained when evaporation was performed with the sapphire substrate being unheated or heated to only about 200° C., and with the evaporated metals or oxides thereof being subsequently annealed to become crystalline.

The above-described first embodiment of the present invention has the advantage that it enables the formation of a superconducting thin film made of IIa-IIIa-Cu oxide.

The second embodiment of the present invention will be described hereinafter. In the second embodiment, a group IIa metal and/or an oxide thereof, a group IIIa metal and/or an oxide thereof, and copper and/or an oxide thereof are evaporated successively, or alternatively, the evaporation of copper and/or an oxide thereof alternates with the evaporation of the two other metals and/or oxides thereof. During the deposition of respective layers in superposition, the substrate is irradiated with an oxygen neutral beam so as to form a superconducting thin film made of laminated IIa, IIIa and Cu oxide layers.

According to the second embodiment of the present invention, the evaporated metals or oxides thereof descent slowly to be deposited in superposition on the substrate. During the process of this evaporation, the substrate is irradiated with an oxygen neutral beam which effectively implants metals or metal oxides into the substrate or into layers that have already been deposited on the substrate, thereby forming a mixing layer at the interface between the substrate and overlying metal or metal oxide layers or between adjacent metal or metal oxide layers. This mixing layer renders deposited coatings to be strongly adherent to one another or to the substrate so that they will not readily separate from one another or from the substrate. The evaporated metal will be oxidized with the oxygen neutral beam as it is deposited on the substrate, and the evaporated metal oxide will be supplied with oxygen in an amount that compensates for the loss that occurred during vapor deposition. As a result of these procedures, a superconducting thin film is formed that consists of IIa, IIIa and Cu oxide layers in superposition on the substrate. This thin film will easily make the transition to the superconducting state by virtue of the homogeneity of its crystalline structure.

Figure 2:
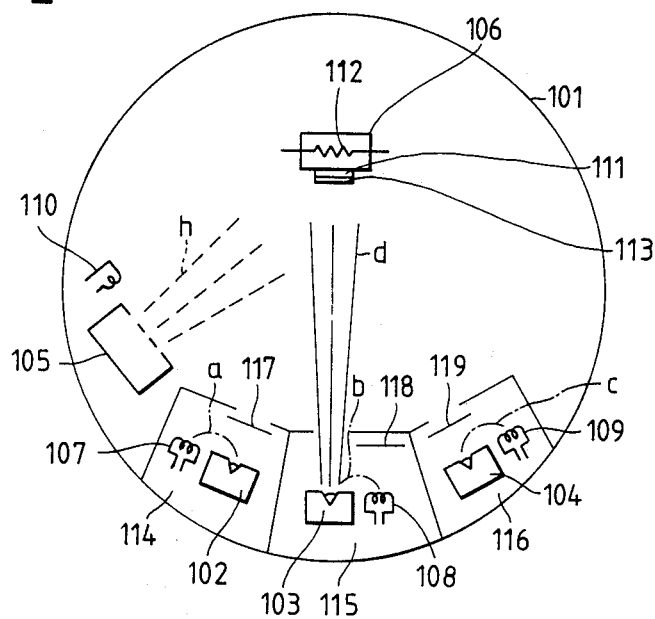
FIG. 2 is a schematic diagram showing a thin-film forming apparatus that may be employed in implementing a process according to the second embodiment of the present invention.

FIG. 2 is a schematic diagram illustrating a thin-film forming apparatus that may be employed in implementing a process according to the second embodiment of the present invention. This apparatus forms a thin film by the ion vapor deposition (IVD) process and comprises a vacuum chamber 101 which contains three crucibles 102, 103 and 104 charged with respective metals serving as evaporation sources, an oxygen ion source 105, and a substrate holder 106.

The crucibles 102, 103 and 104 are respectively charged with a group IIa metal (e.g. Sr or Ba) and/or an oxide thereof, a group IIIa metal (e.g. Sc, Y or La) and/or an oxide thereof, and copper and/or an oxide thereof. The crucibles 102, 103 and 104 are respectively irradiated with electron beams a, b and c supplied from electron beam sources 107, 108 and 109 and the metals or oxides thereof in the respective crucibles are evaporated. The crucibles 102, 103 and 104 making pairs with the associated electron beam sources 107, 108 and 109 are accommodated within evaporation compartments 114, 115 and 116 which are respectively equipped with shutters 117, 118 and 119 that can be slid to be opened or closed.

The oxygen ion source 105 generates oxygen ions in the interior of the vacuum chamber 101. A neutralizer 110 is positioned close to the oxygen ion source 105, and the generated oxygen ions are neutralized to an oxygen neutral beam h. If oxygen ions are directly allowed to impinge on the substrate 111 on the substrate holder 106, static charges will build up on the surface of the thin film being formed on the substrate. If the static buildup exceeds a certain limit, ensuing oxygen ions will be repelled or insulation breakdown of the film will occur. Neutralization of the ions generated from the oxygen ion source 105 is effective in preventing such troubles. The neutralizer 110 may be in the form of a neutralizing filament made of a suitable metal such as tantalum or tungsten. The electrons generated from this filament will neutralize the oxygen ions. The oxygen neutral beam h is preferably radiated in a quantity slightly greater than what is necessary to oxidize evaporated metals.

The substrate holder 106 has a built-in heater 112 and is fitted on its surface with the substrate 111 made of an insulating material such as sapphire or zirconia.

The metals or oxides thereof in the crucibles 102, 103 and 104 are evaporated by the action of electron beams a, b and c generated from the electron beam sources 107, 108 and 109, respectively. This evaporation is performed with either one of the shutters 117, 118 and 119 being opened while the others remain closed. If this selective opening of shutters is effected cylically at given time intervals, layers of predetermined amounts of the evaporated metals or oxides thereof can be deposited in superposition on the surface of the substrate 111. In the case shown in FIG. 2, only the shutter 118 on the evaporation compartment 115 is opened and the heated metal or oxide thereof is evaporated as indicated by d. The amounts in which the metals or oxides thereof evaporated from the compartments 114 through 116 are deposited on the substrate can be appropriately determined by controlling the doses of electron beams and hence the temperatures to which the filaments in the respective electron beam sources are heated, as well as the time period during which shutters 117 through 119 are selectively opened. Preferably, the respective layers are deposited in superposition in such a way that the total amount of a group IIa metal and/or an oxide thereof and a group IIIa metal and/or an oxide thereof will be approximately equal to the amount of copper and/or an oxide thereof as measured on the surface of the substrate 111. The order in which the layers are deposited in superposition is determined by the order in which the shutters 117 through 119 are selectively opened.

Simultaneously with the evaporation, the oxygen ion beam generated from the oxygen ion source and which has been neutralized with the neutralizer 110 into an oxygen neutral beam h is directed onto the surface of the substrate 111. This oxygen neutral beam h not only oxidizes the metals in the process of successive deposition to form oxides but also implants the evaporated metals or oxides thereof into the substrate 111 and into deposited coatings on the substrate, thereby forming mixing layers at the interface between the substrate and overlying layers and between adjacent layers. As a result of these procedures, a superconducting thin film 113 is formed in which the layers of oxides of a group IIa metal, a group IIIa metal and copper deposited in superposition, with the individual layer adhering strongly to one another. The process of the present invention may also be employed to form a coating of a superconducting thin film composed of IIa, IIIa and Cu oxides in layers on the substrate 111 in wire form. The resulting product can be used as a superconducting coil.

In order to crystallize the evaporated metals or oxides thereof, the substrate 111 is heated at about 800° C. with the built-in heater 112 during evaporation. Alternatively, the respective metals or oxides thereof may be evaporated with the substrate 111 being unheated or heated at about 200° C., and with the evaporated metals or oxides thereof being subsequently annealed to become crystalline.

In the above-described second embodiment, the three metals or oxides thereof to be deposited are evaporated successively from compartments 114, 115 and 116 and this has the advantage of enabling the proportions of these metals or oxides thereof to be easily controlled. If de-sired, the shutter on the compartment where a group IIa metal and/or an oxide thereof is to be evaporated and the shutter on the compartment where a group IIIa metal and/or an oxide thereof is to be evaporated may be opened simul-taneously so that a mixed oxide of the two metal is vapor-deposited alternately with a copper oxide layer. This approach would cause no problem since superconductivity is considered to take place chiefly in the copper oxide layer.

In another modification, two evaporation compartments are provided and a group IIa metal and/or an oxide thereof are accommodated in one compartment whereas copper and/or an oxide thereof is charged into the other compartment, with the shutters on the two compartments being allowed to open in turns. In this case, the group IIa metal and/or an oxide thereof and the group IIIa metal and/or an oxide thereof may be accommodated in one compartment either on their own or as an admixture. If desired, an alloy of these metals or an oxide thereof may be used as an evaporant. All of the modifications described above are included within the scope of the present invention.

The following experiments were conducted in order to show the effectiveness of a process for producing a superconducting thin film according to the second embodiment of the present invention.

EXPERIMENT 2-1

Three evaporation compartments were charged with Y, Ba and Cu, respectively, which were evaporated at the rates noted below, with the shutters on the three compartments being opened for 3 seconds and then closed in the following manner: Cu evaporation compartment open; Cu evaporation compartment closed; Y and Ba evaporation compartments open; Y and Ba evaporation compartments closed; Cu evaporation compartment open; Cu evaporation compartment closed; Y and Ba evaporation compartments open; and . . .

| Metal | Evaporation Rate |
|---|---|
| Y | $1.0 \times 10^{15}$ atom/cm$^2$ · sec |
| Ba | $1.4 \times 10^{15}$ atom/cm$^2$ · sec |

-continued

| Metal | Evaporation Rate |
| --- | --- |
| Cu | $2.4 \times 10^{15}$ atom/cm$^2$ · sec |

During the process of evaporation, an oxygen neutral beam was directed onto the substrate. The oxygen neutral beam was produced by neutralizing with a neutralizer an oxygen ion beam having an energy of 100 eV and 0.7 mA/cm$^2$ (on the substrate).

The substrate used was made of a sapphire crystal (C face cleaved) which was heated at 800° C. during deposition of layers in superposition. As a result, a superconducting thin film with a total thickness of 5,000 Å and which was made of Y, Ba and Cu oxides in layers was formed on the surface of the sapphire substrate. A gold electrode was formed on both sides of this superconducting thin film by sputtering and the electrical resistance across this film was measured in liquid nitro-gen. Zero resistance was observed between the electrodes.

The same results were attained when the order of vapor deposition of Y, Ba and Cu was reversed or when these metals were replaced by their respective oxide forms and ion-vapor deposited on a sapphire substrate.

EXPERIMENT 2-2

The procedures of Experiment 2-1 were repeated except that the shutters on the three evaporation compartments were opened for 3 seconds and then closed in the following way: Cu evaporation compartment open; Cu evaporation compartment closed; Y evaporation compartment open; Y evaporation compartment closed; Cu evaporation compartment open; Cu evaporation compartment closed; Ba evaporation compartment open; Ba evaporation compartment closed; Cu evaporation compartment open; and . . . . The other points of difference were the rate of Cu evaporation rate of $1.2 \times 10^{15}$ atom/cm$^2$ sec and the current density of oxygen ion beam of 0.35 mA/cm$^2$. As a result, a 5,000 Å thick supercon-ducting film was formed on a sapphire substrate that con-sisted of layers of Y, Ba and Cu oxides in superposition. The electrical resistance across this thin film was also zero as in Experiment 2-1.

The same results were attained when evaporation was performed in both experiments 2-1 and 2-2 with the sapphire substrate being unheated or heated to only about 200° C., and with the evaporated metals or oxides thereof being subsequently annealed to become crystalline.

The above=described second embodiment of the present invention has the advantage that it enables the formation of a superconducting thin film consisting of superposed layers of IIa, IIIa and Cu oxides.

The third embodiment of the present invention will be described in the following. In this third embodiment of the present invention, a group IIa metal and/or an oxide thereof, a group IIIa metal and/or an oxide thereof and copper and/or an oxide thereof may be deposited in superposition on a substrate by sputtering rather than evaporation. Stated more specifically, a group IIa metal and/or an oxide thereof, a group IIIa metal and/or an oxide thereof and copper and/or an oxide thereof are sputtered successively, or alternatively, the sputtering of copper and/or an oxide thereof alternates with the puttering of the two other metals and/or oxides thereof. During the deposition of respective layers in superposition, the substrate is irradiated with an oxygen neutral beam so as to form a superconducting thin film made of laminated IIa, IIIa and Cu oxide layers.

According to this third embodiment, the sputtered metals or oxides thereof are deposited in superposition on the substrate, forming a multilayered structure (artificial lattice). The oxygen neutral beam being directed to impinge on the substrate oxidizes sputtered metals into their oxide form, whereas it supplies sputtered metal oxides with oxygen in an amount sufficient to compensate for the loss that occurred during sputtering. The oxygen neutral beam also serves as an effective means to implant metals or metal oxides into the substrate or into layers that have already been deposited on the substrate, thereby forming a mixing layer at the interface between the substrate and overlying metal or metal oxide layers or between adjacent metal or metal oxide layers. This mixing layer renders deposited coatings to be strongly adherent to one another or to the substrate so that they will not readily separate from one another or from the substrate. As a result of these procedures, a superconducting thin film is formed that consists of IIa, IIIa and Cu oxide layers in superposition (i.e., multilayered structure) on the substrate. This thin film will readily make the transition to the superconducting state by virtue of the homigeneity of its crystalline structure.

Figure 3:
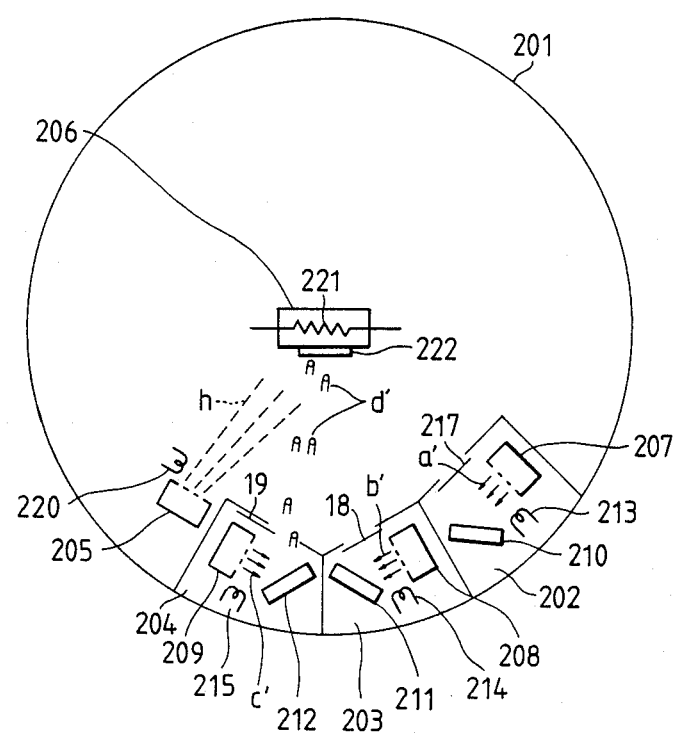
FIG. 3 is a schematic diagram showing a thin-film forming apparatus that may be employed in implementing a process according to the third embodiment of the present invention.

FIG. 3 is a schematic diagram illustrating a thin-film forming apparatus that may be employed in implementing a process according to the third embodiment of the present invention. This apparatus forms a thin film by ion beam sputtering and comprises a vacuum chamber 201 which contains three compartments 202, 203 and 204 for generating sputtered particles, an oxygen ion source 205, and a substrate holder 206.

The compartments 202, 203 and 204 respectively contain sputtering ion sources 207, 208 and 209, as well as associated targets 210, 211 and 212. Each of the ion sources 207, 208 and 209 is so designed that an inert gas such as argon is ionized and extracted through an extracting electrode system. Neutralizers 213, 214 and 215 are disposed in the vicinity of the ion sources 207, 208 and 209, respectively, and the Ar ion beams produced from the ion sources are neutralized with these neutralizers to form Ar neutral beams a', b' and c', which will sputter the respective targets 210, 211 and 212. Each of the neutralizers 213, 214 and 215 is in the form of a neutralizing filament made of a suitable metal such as tungsten or tantalum. If the targets 210 through 212 are made of an insulating material, static charges will build up as a result of impingement of an ion beam and if they exceed a certain limit, insulation breakdown occurs and the targets will be disrupted. Neutralization of the Ar ion beams is effective in preventing such troubles and is not particularly needed if the targets are made of a metal.

The targets 210 through 212 are respectively made of a group IIa metal and/or an oxide thereof, a group IIIa metal and/or an oxide thereof, and copper and/or an oxide thereof, and they are prepared by calcining the powders of these materials at an elevated temperature in the range of from about 1,000 to about 1,200° C.

The compartments 202, 203 and 204 are respectively equipped with shutters 217, 218 and 219 that can be slid to be opened or closed. The order in which these shutters are selectively opened determines the order in which layers are deposited, and the period of time during which they are opened determines the thickness of individual layers to be deposited.

The oxygen ion source 205 generates an oxygen ion beam in the interior of the vacuum chamber 201. A neutralizer 220 is positioned close to the oxygen ion source 205, and the generated oxygen ion beam is neutralized to an oxygen neutral beam h. If oxygen ions are directly allowed to impinge on the substrate 222 on the substrate holder 206, static charges will build up on the surface of the thin film being formed on the substrate. If the static buildup exceeds a certain limit, ensuing oxygen ions will be repelled or insulation breakdown of the film will occur. Neutralization of the oxygen ions generated from the oxygen source 205 is effective in preventing such troubles. The neutralizer 220 may be in the form of a neutralizing filament made of a suitable metal such as tantalum or tungsten. The electrons generated from this filament will neutralize the oxygen ions. The oxygen neutral beam h is preferably radiated in a quantity slightly greater than what is necessary to oxidize deposited metals.

The substrate holder 206 has a built-in heater 221 and is fitted on its surface with the substrate 222 made of an insulating material such as sapphire or zirconia.

Ion beams with an energy of the order of 500 through 2,000 eV that have been extracted from the sputtering ion sources 207 through 209 are neutralized with the neutralizers 210, 211 and 212 into neutral beams. The neutral beams sputter the targets 210 through 212 from which sputtered particles will be emitted. This sputtering operation is performed with either one of the shutters 217, 218 and 219 being opened while the others remain closed. If this selective opening of shutters is effected cyclically at given intervals, layers of predetermined amounts of the sputtered particles of the respective metals or oxides thereof can be deposited in superposition on the surface of the substrate 222. In the case shown in FIG. 3, only the shutter 219 on the compartment 204 is opened and the particles of the sputtered metal or oxide thereof will fly out of the compartment 204 as indicated by d'. The oxygen ion beam generated from the oxygen ion source 205 is neutralized with the neutralizer 210 to an oxygen neutral beam h, which is directed toward the substrate 222 and oxidizes the thin layers being deposited in superposition. As a result of these procedures, a superconducting thin film 213 is formed in which the layers of oxides of a group IIa metal, a group IIIa metal and copper are deposited in superposition, with the individual layers ad-hering strongly to one another. The process of the embodiment may also be employed to form a coating of a superconducting thin film composed of IIa, IIIa and Cu oxides in layers on the substrate 222 in wire form. The resulting product can be used as a superconducting coil.

In order to accelerate the reaction taking place on the substrate 222, the latter is heated at about 700° C. with the built-in heater 221 during sputtering. Alternatively, the respective metals or oxides thereof may be sputtered with the substrate 222 being unheated or heated at about 200° C., and with the sputtered metals or oxides thereof being subsequently annealed.

In the above-described embodiment, the three metals or oxides thereof in the compartments 202, 203 and 204 are successively sputtered to knock off particles therefrom, and this has the advantage of enabling the proportions of these metals or oxides thereof to be easily controlled. If desired, the shutter on the compartment accommodating a group IIa metal and/or an oxide thereof and the shutter on the compartment containing a group IIIa metal and/or an oxide thereof may be opened simultaneously so that a mixed oxide of the two metals is deposited alternately with a copper oxide layer.

In another modification, two evaporation compartments are provided and a group IIa metal and/or an oxide thereof and a group IIIa metal and/or an oxide thereof are accommodated as a mixed target in one compartment, whereas copper and/or an oxide thereof is charged as a target into the other compartment, with the shutters on the two compartments being allowed to open in turns. In this case, the group IIa metal and/or an oxide thereof and the group IIIa metal and/or an oxide thereof may be accommodated as separate targets in the one compartment. If desired, an alloy of these metals or an oxide thereof may be used as a target. All of the modifications described above are included within the cope of the present invention.

The following experiments were conducted in order to show the effectiveness of a process for producing a superconducting thin film according to the third embodiment of the present invention.

EXPERIMENT 3-1

Three targets $Y_2O_3$, BaO and CuO, were placed in separate compartments, which were mounted within a film-forming reactor (vacuum chamber) 201 evacuated to a pressure of $1 \times 10^{-5}$ Torr. A sapphire substrate 222 was heated at 200° C. An AR ion beam was used as a sputtering ion source and controlled to have an energy of 1 keV and 1 mA. An oxygen ion beam was used as an oxygen ion source and controlled to have an energy of 100V and 0.5 mA. This oxygen ion beam was neutralized and bombarded against the substrate.

A multi-layered film was produced by cyclically opening and closing the shutters on the three compartments in the following way: Cu compartment open; Cu compartment closed; Ba compartment open, Ba compartment closed; Cu compartment open; Cu compartment closed; Y compartment open; Y compartment closed; Cu compartment open; and .... The duration of time for which each shutter was allowed to open was controlled so that each of the layers of Y, Ba and Cu oxides would be deposited in a thickness of 5 Å.

The deposited layers were annealed at 700° C. in an electric furnace. As a result, a superconducting thin film with a total thickness of 1,000 Å and which was made of Y, Ba and Cu oxides in superposed layers was formed on the surface of the sapphire substrate. A gold electrode was formed on both sides of this superconducting thin film by sputtering and the electrical resistance across this film was measured in liquid nitrogen. Zero resistance was observed between the electrodes.

The same results were attined when the order of sputtering Y, Ba and Cu was reversed or when these metals were replaced by their respective oxide forms and sputter-deposited on a sapphire substrate.

EXPERIMENT 3-2

The procedures of Experiment 3-1 were repeated except that the shutters on the three compartments were cyclically opened and closed in the following way: Cu compartment open; Cu compartment closed; Y and Ba compartments open; Y and Ba compartments closed; Cu compartment open; Cu compartment closed; Y and Ba compartments open; and .... As in Experiment 3-1, the superconducting thin film produced in this experiment exhibited zero resistance between electrodes.

The same results were attained when sputtering was performed in both Experiments 3-1 and 3-2 with the sapphire substrate being heated at about 700° C. and not subjected to subsequent annealing.

The above-described third embodiment of the present invention has the advantage that it enables the formation of a superconducting thin film consisting of superposed layers of IIa, IIIa and Cu oxides.

As described above, according to the present invention, it becomes possible to form a superconducting thin film of IIa, IIIa and Cu oxides. The film may have either the construction that the film consists of layers of IIa, IIIa and Cu oxides superposed on one another or the construction that the film is made of IIa-IIIa-Cu oxide.

What is claimed is:

1. A process for producing a superconducting thin film comprising:

supplying onto a substrate a group IIa metal and/or an oxide thereof, a group IIIa metal and/or an oxide thereof, and copper and/or an oxide thereof; and irradiating the substrate with an oxygen neutral beam, to thereby form a thin film of IIa-IIIa-Cu oxide.

2. A process according to claim 1, wherein a group IIa metal and/or an oxide thereof, a group IIIa metal and/or an oxide thereof, and copper and/or an oxide thereof are simultaneously vapor-deposited on the substrate.

3. A process according to claim 1, wherein a group IIa metal and/or an oxide thereof, a group IIIa metal and/or an oxide thereof, and copper and/or an oxide thereof are successively evaporated to form layers in superposition on the substrate.

4. A process according to claim 1, wherein copper and/or an oxide thereof is evaporated alternately with the two other metals and or oxides thereof to form layers in superposition on the substrate.

5. A process according to claim 1, wherein a group IIa metal and/or an oxide thereof, a group IIIa metal and/or an oxide thereof, and copper and/or an oxide thereof are successively sputtered to form layers in superposition on the substrate.

6. A process according to claim 1 wherein copper and/or an oxide thereof is sputtered alternately with the two other metals and/or oxides thereof to form layers in superposition on the substrate.

* * * * *